US011996810B2

(12) United States Patent
Martin et al.

(10) Patent No.: US 11,996,810 B2
(45) Date of Patent: May 28, 2024

(54) DIGITAL COMPENSATION SYSTEM FOR A RADIO FREQUENCY POWER AMPLIFIER MODULE

(71) Applicant: Qorvo US, Inc., Greensboro, NC (US)

(72) Inventors: Frederick L. Martin, Plantation, FL (US); Gangadhar Burra, Fremont, CA (US); Nikolaus Klemmer, Dallas, TX (US); Paul Edward Gorday, West Palm Beach, FL (US); Bror Peterson, Fairview, TX (US)

(73) Assignee: Qorvo US, Inc., Greensboro, NC (US)

( * ) Notice: Subject to any disclaimer, the term of this patent is extended or adjusted under 35 U.S.C. 154(b) by 368 days.

(21) Appl. No.: 17/245,027

(22) Filed: Apr. 30, 2021

(65) Prior Publication Data

US 2021/0344313 A1    Nov. 4, 2021

Related U.S. Application Data

(60) Provisional application No. 63/018,661, filed on May 1, 2020.

(51) Int. Cl.
  *H03F 3/24*  (2006.01)
  *H03F 1/02*  (2006.01)
  *H03F 3/195*  (2006.01)

(52) U.S. Cl.
  CPC ........... *H03F 3/245* (2013.01); *H03F 1/0227* (2013.01); *H03F 1/0288* (2013.01); *H03F 3/195* (2013.01); *H03F 2200/102* (2013.01); *H03F 2200/168* (2013.01); *H03F 2200/451* (2013.01)

(58) Field of Classification Search
  CPC ....... H03F 3/245; H03F 1/0227; H03F 1/0288
  USPC ........................................................ 330/285
  See application file for complete search history.

(56) References Cited

U.S. PATENT DOCUMENTS 7,948,318 B2 * 5/2011 Hongo ...................... H03F 3/19
                                                    330/296
8,050,353 B2 * 11/2011 Sorrells ..................... H03F 1/30
                                                    375/229
2007/0184792 A1 * 8/2007 Drogi .................... H03F 1/0216
                                                    455/127.1

(Continued)

OTHER PUBLICATIONS

Kenington, P.B., et al., "A GSM-EDGE High Power Amplifier Utilising Digital Linearisation," IEEE MTT-S International Microwave Symposium Digest, 2001, pp. 1517-1520.

(Continued)

*Primary Examiner* — Patricia T Nguyen
(74) *Attorney, Agent, or Firm* — Withrow & Terranova, P.L.L.C.

(57) ABSTRACT

A digital compensation system for a radio frequency (RF) power amplifier module is disclosed. The digital compensation system includes an RF power amplifier having a first input, a first output, and a first bias input, wherein the RF power amplifier is configured to receive an RF signal at the first input and generate an amplified version of the RF signal at the first output. The digital compensation system also includes compensation circuitry coupled between the first input and the first output and a bias output coupled to the RF power amplifier, wherein the compensation circuitry is configured, in response to the RF signal, to generate or adjust a bias signal at the first bias input to correct dynamic bias errors caused by amplification variations that have time constants.

23 Claims, 7 Drawing Sheets

(56) References Cited

U.S. PATENT DOCUMENTS

| | | | |
|---|---|---|---|
| 2007/0184795 A1* | 8/2007 | Drogi | H03G 3/004 |
| | | | 455/127.1 |
| 2014/0084700 A1 | 3/2014 | Anderson et al. | |
| 2014/0354350 A1* | 12/2014 | Bowers | H03F 1/301 |
| | | | 327/564 |
| 2015/0162882 A1* | 6/2015 | Tam | H03F 1/0216 |
| | | | 330/291 |
| 2015/0236877 A1* | 8/2015 | Peng | H03F 1/0227 |
| | | | 375/297 |
| 2018/0198424 A1* | 7/2018 | Sharma | H03F 3/45188 |
| 2020/0244232 A1 | 7/2020 | Cope et al. | |

OTHER PUBLICATIONS

Extended European Search Report for European Patent Application No. 23152763.1, dated Jun. 15, 2023, 11 pages.

* cited by examiner

DIGITAL COMPENSATION SYSTEM FOR A RADIO FREQUENCY POWER AMPLIFIER MODULE

RELATED APPLICATIONS

This application claims the benefit of provisional patent application Ser. No. 63/018,661, filed May 1, 2020, the disclosure of which is hereby incorporated herein by reference in its entirety.

FIELD OF THE DISCLOSURE

The present disclosure is related to radio frequency power amplifiers.

BACKGROUND

Present radio frequency (RF) amplifier systems can include a gallium nitride (GaN) device that makes up a controlled RF amplifier, a drain-current senser, circuitry for controlling drain current by manipulating gate voltage of the GaN device, and a baseband processor having a low-speed data bus coupling the baseband processor to a power amplifier module in which the GaN device is integrated. The circuitry for controlling drain current further comprises an analog-to-digital converter for converting the magnitude of the drain current to a digital representation, a digital-to-analog converter for converting the digital representation of a gate bias value to an analog voltage coupled to a gate of the GaN device, and a logic block for, among other things, setting the GaN device gate voltage. A codeplug (one-time programmable) provides settings for the power amplifier control logic block. A negative voltage generator provides a negative voltage to serve as a power supply to generate the gate bias voltage to the GaN device. The negative voltage generator provides a practical means of biasing the GaN device, which is typically depletion mode and requires a negative gate voltage to function correctly.

In operation, these RF amplifier systems can perform pre-wired control functions such as gate-bias generation. However, because stored information is one-time programmable, all characterization must be accomplished during the manufacturing process. The current sense operates only at direct current and so cannot be used when an alternating current signal is present. The power amplifier control logic comprises registers that can be written from the baseband processor, so overrides of codeplug information are possible. All decision-making beyond some simple hard-wired functions must be implemented in the baseband controller. As such, there is a latency between the baseband controller and the power amplifier module. This latency makes mitigation of trapping and drift in transmit devices such as the GaN device nonrealizable or at least impractical. Thus, there remains a need for a digital compensation system configured to provide low latency control of devices that comprise RF amplifiers to mitigate charge trapping and drift in the devices.

SUMMARY

A digital compensation system for a radio frequency (RF) power amplifier module is disclosed. The digital compensation system includes an RF power amplifier having a first input, a first output, and a first bias input, wherein the RF power amplifier is configured to receive an RF signal at the first input and generate an amplified version of the RF signal at the first output. The digital compensation system also includes compensation circuitry coupled between the first input and the first output and a bias output coupled to the RF power amplifier, wherein the compensation circuitry is configured, in response to the RF signal, to generate or adjust a bias signal at the first bias input to correct dynamic bias errors caused by amplification variations that have time constants.

Also disclosed is a method for improving the performance of a RF front-end module, particularly on the transmit side. Structural improvements include adding a processor and a memory device to the RF front-end module, a mode of sensing so that the processor can gain information about the devices in the module, and a data bus for supplying condensed information about the modulating signal to the transmitter portion of the module. In the method as disclosed, data from the sensors and from the data bus are combined with stored characterization information to mitigate trapping and drift in transmit devices.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
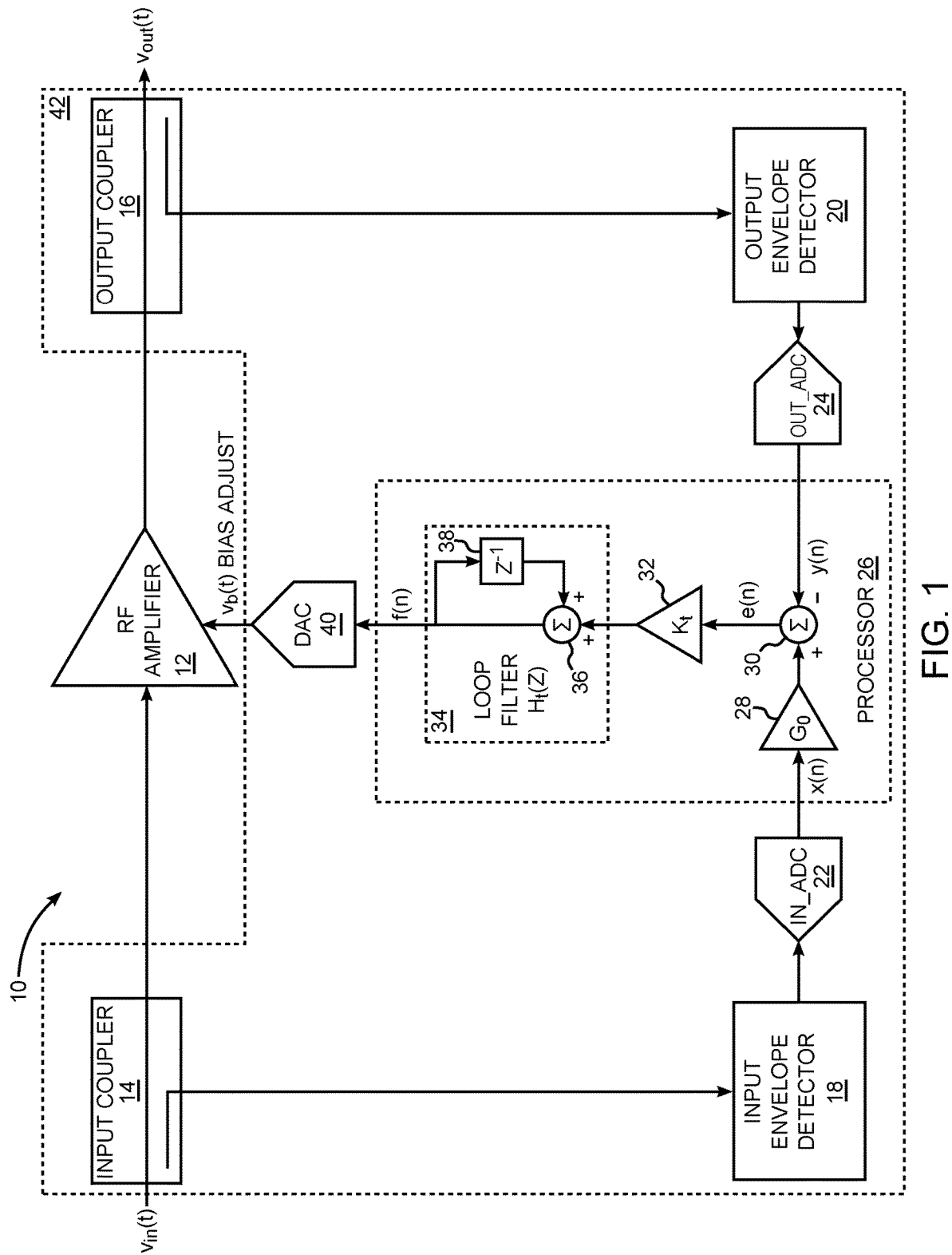
FIG. 1 is a schematic of a digital compensation system that is structured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Figure 2:
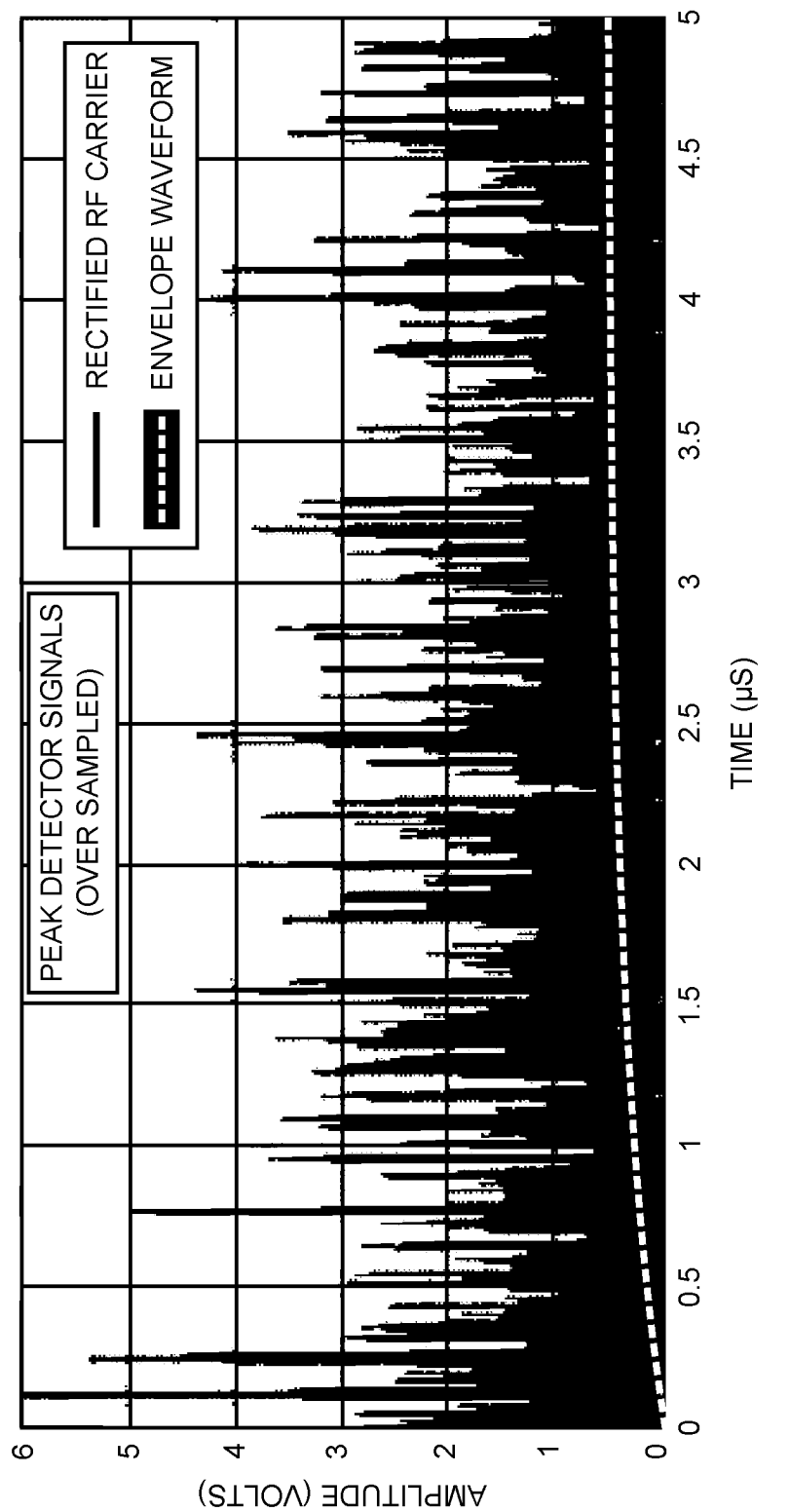
FIG. 2 is a graph of amplitude versus time for a rectified radio frequency (RF) carrier and an estimated average signal envelope waveform.

FIG. 1 is a schematic of a digital compensation system 10 that is structured in accordance with the present disclosure. The digital compensation system 10 of FIG. 1 is configured to compensate for amplifier bias errors produced by phenomena such as temperature drift, device aging, and charge trapping. The digital compensation system 10 includes a radio frequency (RF) amplifier 12 that receives an input signal, $v_{in}(t)$, and generates an output signal, $v_{out}(t)$, both of which are typically modulated RF carrier signals. An input coupler 14 and an output coupler 16 divert a small amount of the RF signal power to an input envelope detector 18 and an output envelope detector 20 without significant loss or degradation of the performance of the RF amplifier 12. The input envelope detector 18 and the output envelope detector 20 provide rectification and filtering of the RF carrier signals to estimate average signal envelopes, as shown in FIG. 2. The input coupler 14 is coupled to a signal input of the RF amplifier 12 and has an input signal tap coupled to the input envelope detector 18. The output coupler 16 is coupled to a signal output of the RF amplifier 12 and has an output signal tap coupled to the output envelope detector 20.

Returning to FIG. 1, the envelope waveforms are sampled using an input analog-to-digital converter 22 (IN_ADC) and an output analog-to-digital converter 24 (OUT_ADC). A processor 26 processes the sampled envelope waveforms digitally. The processor 26 may be a microprocessor, a digital signal processor, or some other combination of fixed and programmable logic. Within the processor 26, a first configurable digital gain block 28 having a first gain $G_o$ is applied to an input envelope, $x(n)$, and an error signal $e(n)=G_o x(n)-y(n)$ is output from an error signal output of a first summation node 30. The gain-adjusted input envelope acts like a reference signal against which the output envelope is compared. Alternatively, the first gain $G_o$ can be applied to the output envelope to form an alternate error signal, $e'(n)=x(n)-G_o y(n)$, without fundamentally changing the functionality of the digital compensation system 10. Under nominal conditions the value of the first gain $G_o$ is determined such that the error signal is very small (approximately zero). Amplifier bias errors affect an output envelope level, $y(n)$, resulting in a non-zero error signal. The error signal is scaled by a second configurable digital gain block 32 having a second gain $K_r$. The scaled error signal is then smoothed by a digital loop filter 34 having a transfer function $H_r(z)$. The loop filter 34 includes a second summation node 36 and a delay register block 38 coupled between an input to the second summation node 36 and an output of the second summation node 36. The second summation node 36 sums a scaled error signal that is output from the second configurable digital gain block 32 with a feedback output of the delay register block 38. It is to be understood that the $Z^{-1}$ notation in FIG. 1 represents the z-transform of a single-sample delay. It is also to be understood that other filter structures in place of the loop filter 34 may be used.

A loop filter output, f(n), is converted to an analog bias adjustment signal, $v_b(t)$, using a digital-to-analog converter (DAC) 40. The analog bias adjustment signal, $v_b(t)$, is applied to bias the RF amplifier 12. The polarity of the bias adjustment is such that $v_b(t)$ acts to reduce the bias error. As such, digital compensation system 10 is a closed-loop feedback control type system that realizes the objective to mitigate bias errors and thereby minimize variations in gain and linearity characteristics of the RF amplifier 12. The input coupler 14, the output 16, the input envelope detector 18, the output envelope detector 20, the IN_ADC 22, the OUT_ADC 24, the processor 26, and the DAC 40 make up compensation circuitry 42.

Figure 3A:
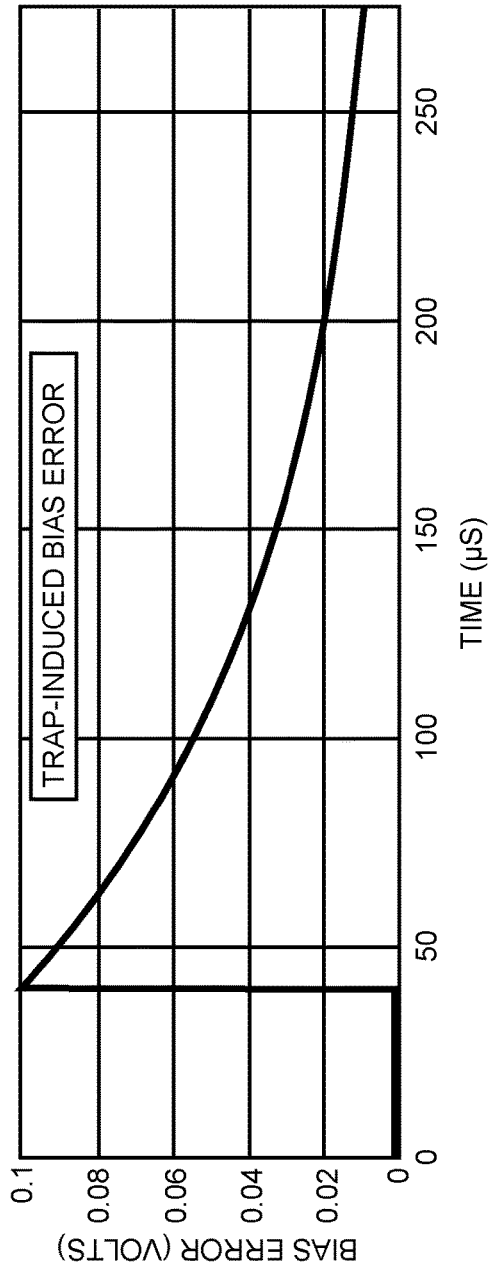
FIG. 3A is a graph of trap-induced bias error versus time.
Figure 3B:
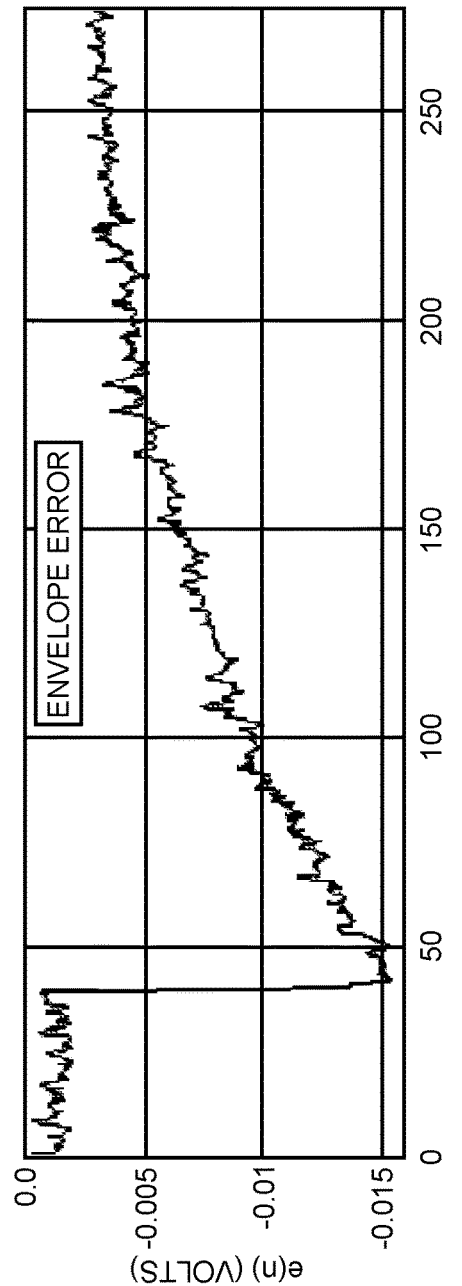
FIG. 3B is a graph of envelope error versus time.
Figure 4A:
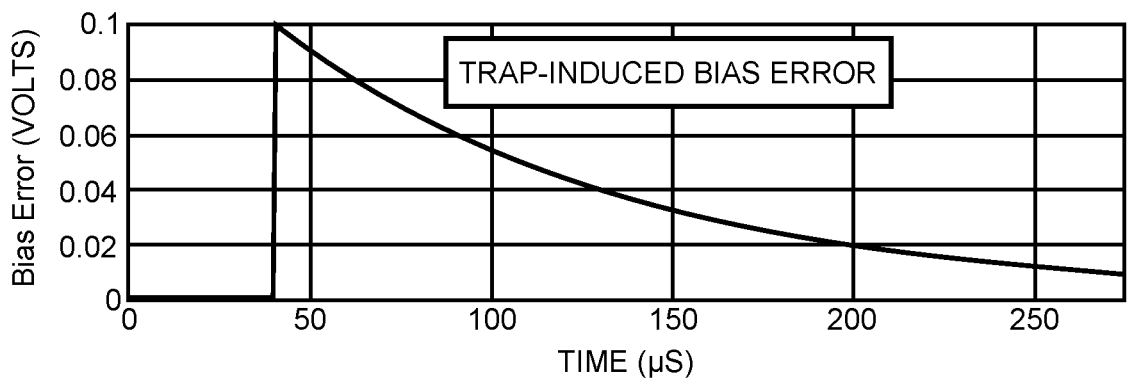
FIG. 4A is a graph of trap-induced bias error versus time.
Figure 4B:
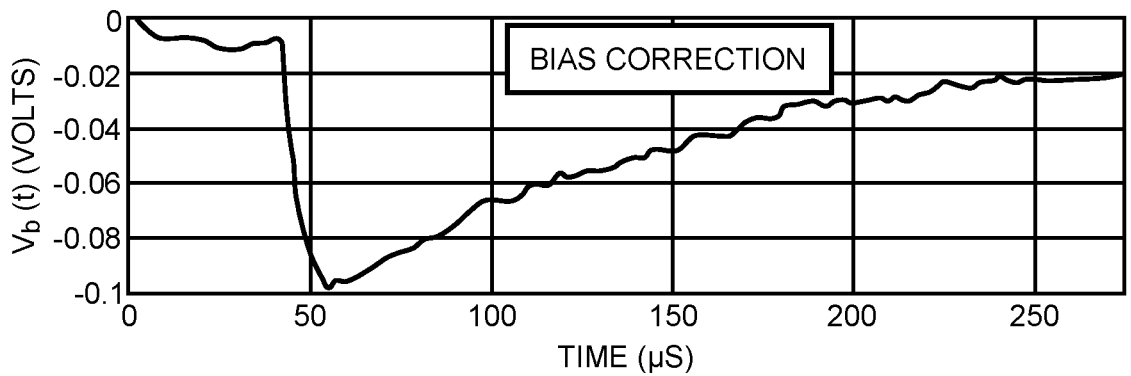
FIG. 4B is a graph of bias-correction versus time.
Figure 4C:
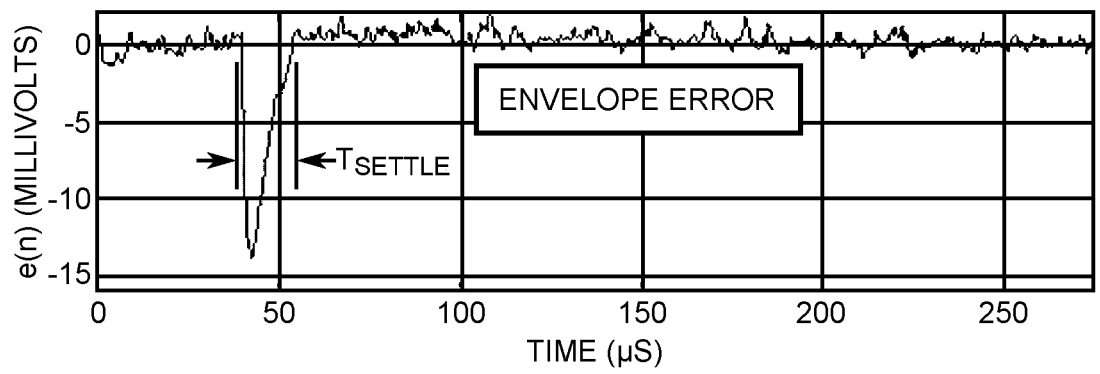
FIG. 4C is a graph of envelope error.

FIG. 3A and FIG. 3B are graphs showing example waveforms for a gallium nitride (GaN)-based amplifier with bias errors due to charge trapping. The bias error forms suddenly and then decays exponentially with a time constant of 100 µs. With compensation disabled, an envelope error signal e(n) is proportional to the bias error. FIG. 4 shows that when compensation is enabled, the output envelope is restored after a short compensation settling period, $T_{settle}$, thus demonstrating that the effects of the bias error have been significantly mitigated. It is to be understood that the presently disclosed method is applicable for any type of amplification device that suffers from memory effects longer than what can be corrected with methods known in the art, such as digital pre-distortion. For example, charge trapping is not limited to GaN because it is expected that charge trapping may be in any semiconductor process that uses carrier material with lattice mismatch relative to the material used for the transistor implementation. Aluminum nitride-based transistors are an example of transistors that are susceptible to charge trapping. Other examples include GaN-silicon nitride, which has a 3.5% lattice mismatch, and GaN-silicon, which exhibits even worse charge trapping. Conversely, GaN transistors on GaN substrates have much lower (e.g., 1000×) defect density and would not fall under this type of GaN.

Figure 5:
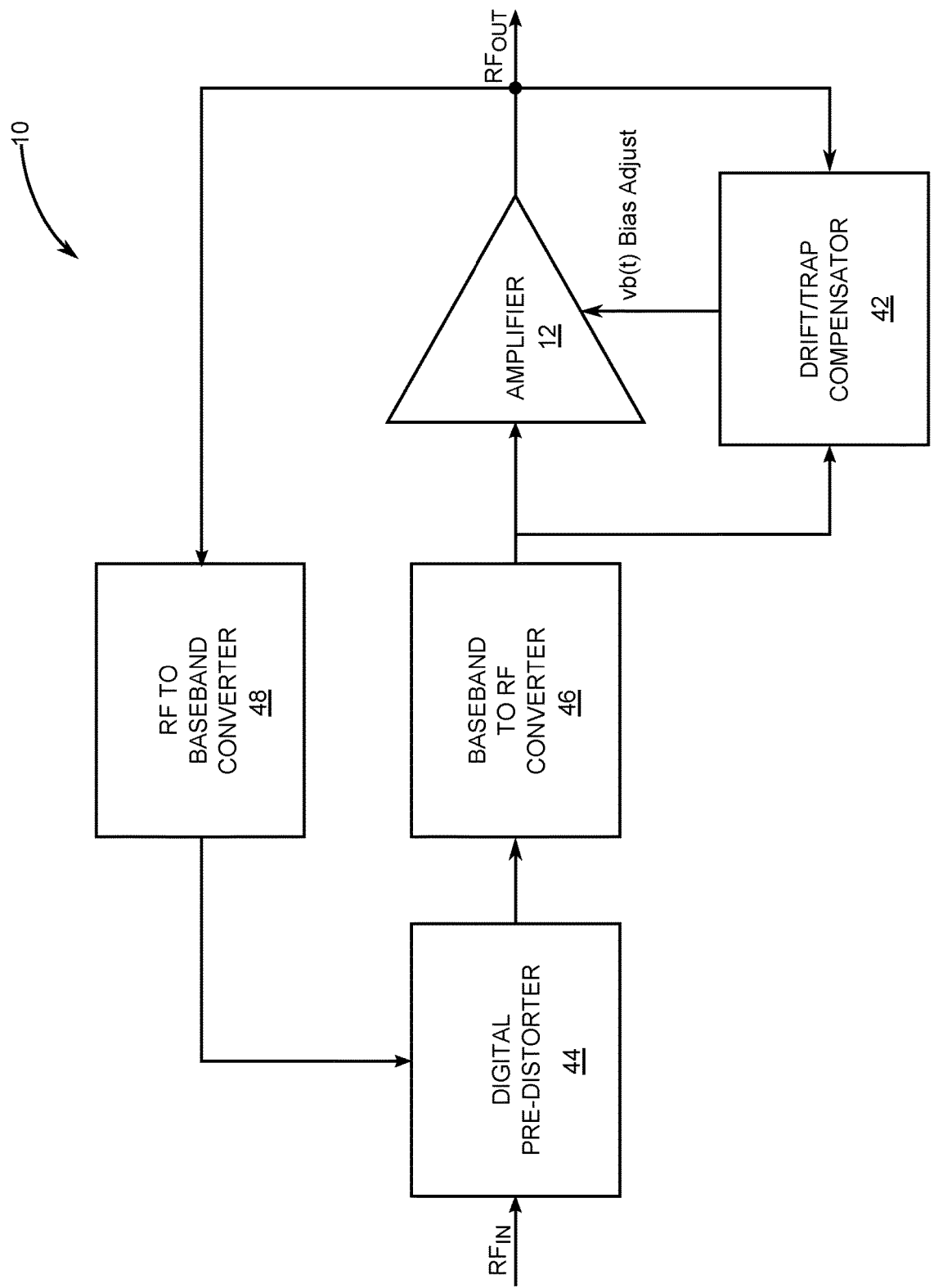
FIG. 5 is a simplified schematic of another embodiment of the digital compensation system that is further configured for drift mitigation in accordance with the present disclosure.

The compensation system 10 is expected to be complimentary to a wideband digital pre-distorter (DPD) 44 used to linearize the RF amplifier 12, as shown in FIG. 5. In at least some embodiments, the compensation settling period $T_{settle}$ is as short as practical. Specifically, the bandwidth of the input envelope detector 18 and the output envelope detector 20, along with the sampling rates of the IN_ADC 22, the OUT_ADC 24, and the DAC 40, determine the duration of the compensation settling period $T_{settle}$. As depicted in FIG. 5, a compensation circuitry 42 operates as an inner loop to quickly correct any sudden bias errors caused by amplification variations that have time constants, while the DPD 44 acts as a slower outer loop to correct for amplifier nonlinearity. Typical DPD implementations compute their coefficients based on observation periods (blocks) lasting tens of microseconds. The compensation settling period $T_{settle}$ is smaller than a DPD block duration, $T_{dpd}$, in order to minimize effects of the bias errors on DPD coefficient calculations. Amplification variations that have time constants include but are not limited to amplification gain fluctuations due to charge trapping and amplifier gain fluctuations due to temperature changes.

The 3-dB bandwidth for the envelope detectors is $B_e=f_s/10$, where $f_s$ is the ADC/DAC sampling rate. This provides good suppression to aliasing in the ADC sampling process.

The second gain $K_t$ is set to a value that provides a critically damped response to a sudden (step) change in bias error. This value depends on the sensitivity of the RF amplifier 12 to bias errors and on other gains along each feedback path within the digital compensation system 10. When critically damped, the setting time of the closed-loop system is approximately $T_{settle} \approx 32/f_s$. To restrict the compensation settling period $T_{settle}$ to be less than the DPD block duration, $T_{dpd}$, the ADC/DAC sampling rate is $f_s \geq 32/T_{dpd}$. A baseband to RF converter 46 is coupled between the DPD 44 and the signal input of the RF amplifier 12, and an RF to baseband converter 48 is coupled between the signal output of the RF amplifier 12 and an input of the DPD 44.

Figure 6:
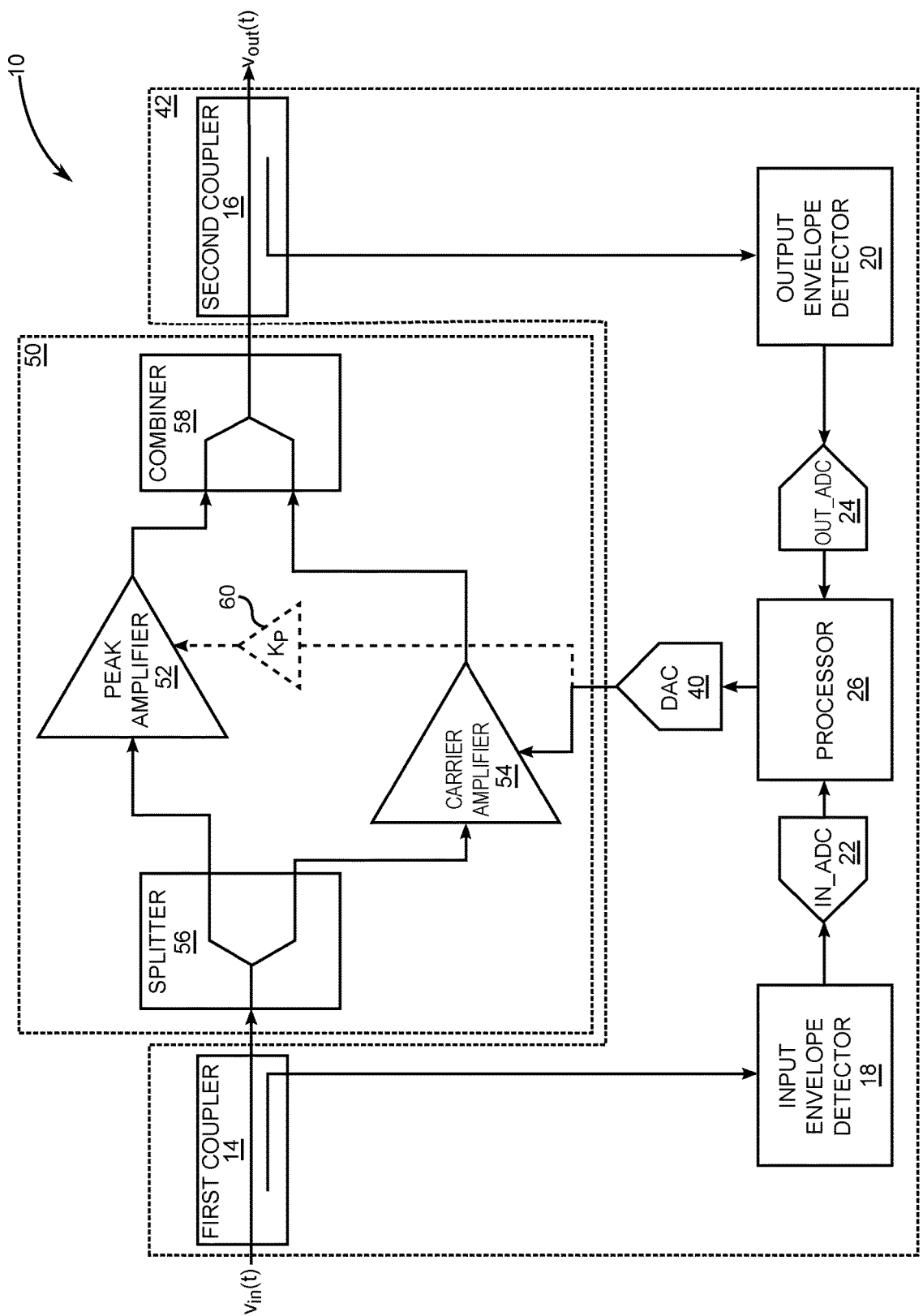
FIG. 6 is a schematic of another embodiment of the digital compensation system that is configured to provide bias-correction to a Doherty amplifier in accordance with the present disclosure.

FIG. 6 is a schematic of another embodiment of the digital compensation system 10. In this embodiment, the digital compensation system 10 is configured to provide bias-correction to a Doherty amplifier 50 in accordance with the present disclosure. The Doherty amplifier 50 has a peak amplifier 52 and a carrier amplifier 54 that are coupled in parallel. A splitter 56 is coupled between the first coupler 14 and the inputs of the peak amplifier 52 and the carrier amplifier 54. The splitter 56 divides the input signal $v_{in}(t)$ between the peak amplifier 52 and the carrier amplifier 54. A combiner 58 is coupled between outputs of the peak amplifier 52 and the carrier amplifier 54 and the second coupler 16. The combiner 58 joins portions of the output signal $v_{out}(t)$ from outputs of the peak amplifier 52 and carrier amplifier 54.

The carrier amplifier 54 provides power amplification to input signals with low-to-medium signal strength. For larger input signals, the carrier amplifier saturates and no further amplification is possible. At the point of carrier saturation, the peak amplifier 52 turns on and provides additional amplification to the strong input signal peaks.

The carrier amplifier 54 and peak amplifier 52 are both susceptible to bias errors, so a straightforward solution is to use two independent compensation loops—one for each of the carrier amplifier 54 and the peak amplifier 52. This may be desirable if the bias errors of the carrier amplifier 54 and the peak amplifier 52 are substantial and uncorrelated. An alternative is to use a single compensation loop, as illustrated in FIG. 6. The input envelope detector 18 is coupled to the input coupler 14, but it could equivalently be coupled to an input of the splitter 56 or either input of the peak amplifier 52 or the carrier amplifier 54. The output envelope detector 20 is coupled to the second coupler 16 or the output of the combiner 58, which contains the composite amplified signal. The feedback bias adjustment signal is shared by the peak amplifier 52 and the carrier amplifier 54, with the feedback signal to the peak amplifier 52 being weighted by a scaling factor $K_p$ of a peak bias gain block 60. For the case of $K_p=0$, only the carrier amplifier is compensated. This may be sufficient when bias errors on the peaker amplifier have negligible or minor effect on the output envelope. When bias errors on both amplifiers are significant and correlated, $K_p$ can be determined to minimize their combined effects on the output envelope.

Figure 7:
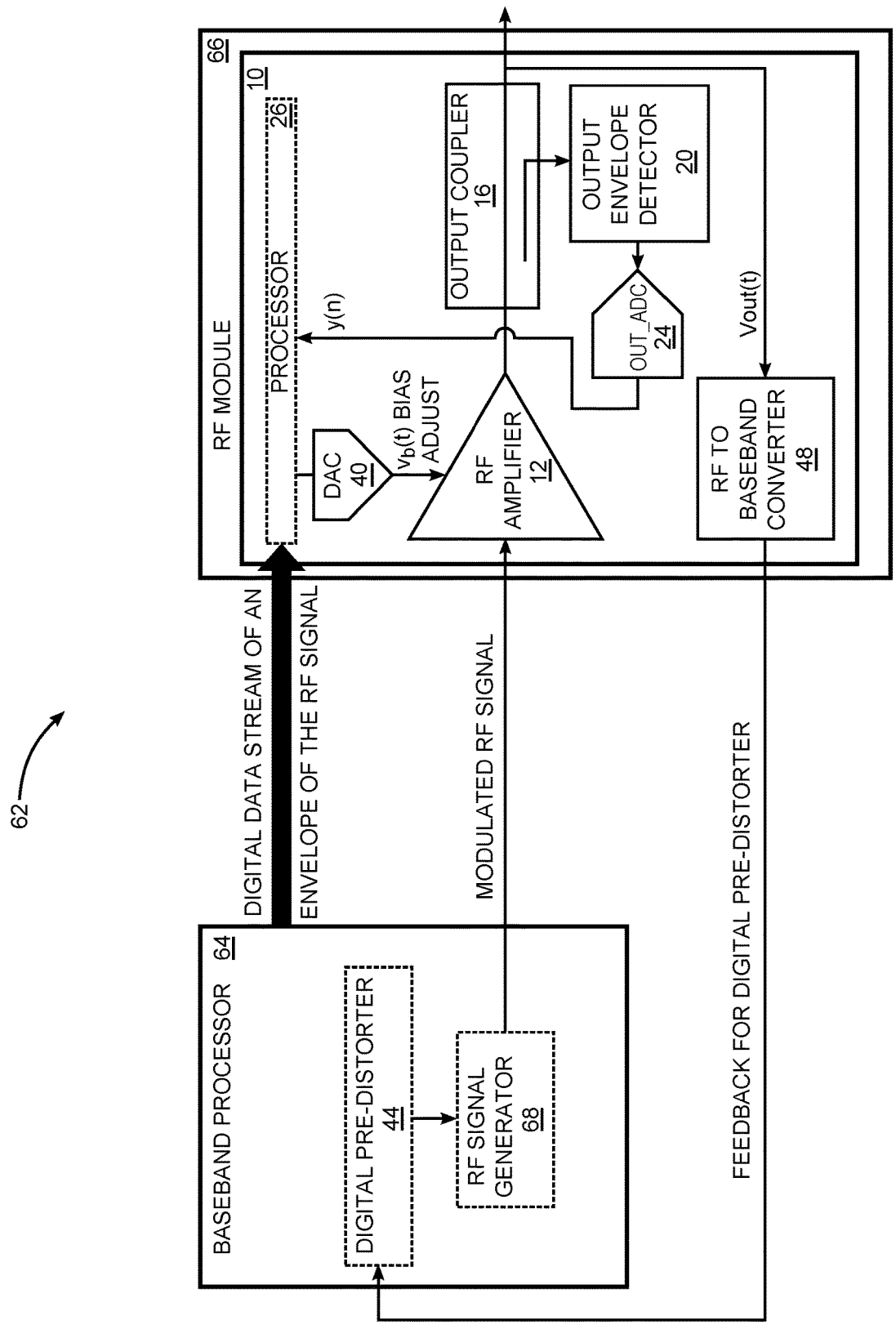
FIG. 7 is a block diagram of an embodiment of a RF front-end in which an external baseband processor is configured to provide a digital data stream representing an RF signal envelope to the processor of an alternative embodiment of the digital compensation system.

FIG. 7 is a block diagram of an embodiment of a RF front-end 62 in which an external baseband processor 64 is configured to provide a first digital signal that is a first digital data stream representing an RF signal envelope to the processor 26 of an alternative embodiment of the digital compensation system 10. In this embodiment, the processor 26 is structured as depicted in detail in FIG. 1 and is configured to operate the same as described above for the embodiment of FIG. 1. As such, the processor 26 is configured to receive the first digital signal and in response to generate a digital bias signal that the DAC 40 converts into the analog bias adjustment signal, $v_b(t)$, to correct dynamic bias errors caused by the amplification variations that have time constants.

In this embodiment, the external baseband processor 64 eliminates the need for the input coupler 14, the input envelope detector 18, and the input analog-to-digital converter 22 depicted in FIG. 1. However, this embodiment integrates the RF amplifier 12, the output coupler 16, the output envelope detector 20, the output analog-to-digital converter 24, the processor 26, the digital-to-analog converter 40, and the RF to baseband converter 48 into an RF module 66 that is separate from the baseband processor 64. The processor 26 is configured to receive the second digital signal y(n), and in response to adjust the digital bias signal $v_b(t)$ to further correct dynamic bias errors caused by the amplification variations that have time constants.

Referring to the baseband processor 64, the DPD 44 generates a digital pre-distortion signal that in turn drives an RF generator 68. A modulated RF signal generated by the RF signal generator 68 drives the input of the RF amplifier 12. The amplified RF signal at the output of the RF amplifier 12 is tapped to provide RF feedback for the DPD 44. In the exemplary embodiment of FIG. 7, the tapped RF signal is the output signal, $v_{out}(t)$, which is converted to a baseband feedback signal by the RF to baseband converter 48. The baseband feedback signal is feedback for the digital pre-distorter 44.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A digital compensation system for a radio frequency (RF) power amplifier module comprising:
    an RF power amplifier having a first input, a first output, and a first bias input, wherein the RF power amplifier is configured to receive an RF signal at the first input and generate an amplified version of the RF signal at the first output; and
    compensation circuitry coupled between the first input and the first output and a bias output coupled to the RF power amplifier, wherein the compensation circuitry is configured, in response to the RF signal, to generate a bias signal at the first bias input to correct dynamic bias errors caused by amplification variations that have at least one time constant encompassing amplification gain fluctuations due to charge trapping within the RF amplifier.

2. The digital compensation system of claim 1 wherein the compensation circuitry comprises:
    an input envelope detector having a first detector input coupled to the first input and a first detector output, wherein the input envelope detector is configured to generate a rectified and filtered version of the RF signal;
    an input analog-to-digital converter having a first converter input coupled to the first detector output and a first converter output, wherein the input analog-to-digital converter is configured to generate a first digital signal in proportion to the RF signal; and
    a processor having a first processor input coupled to the first converter output, and a processor bias output coupled to the first bias input, wherein the processor is configured to receive the first digital signal and in response generate a digital bias signal at the processor bias output to correct dynamic bias errors caused by the amplification variations that have time constants.

3. The digital compensation system of claim 2 further comprising a digital-to-analog converter having a digital input coupled to the processor bias output and an analog output coupled to the first bias input of the RF amplifier, wherein the digital-to-analog converter is configured to receive the digital bias signal from the processor and convert the digital bias signal into an analog bias signal at the first bias input.

4. The digital compensation system of claim 2 wherein the compensation circuitry further comprises an input coupler coupled to a signal input of the RF amplifier, wherein the input coupler has an input signal tap coupled to the input envelope detector with the input coupler being configured to divert a portion of the RF signal to the input envelope detector.

5. The digital compensation system of claim 3 wherein the compensation circuitry further comprises:
    an output envelope detector having a second detector input coupled to the second input and a second detector output, wherein the output envelope detector is configured to generate a rectified and filtered version of the amplified RF signal; and
    an output analog-to-digital converter configured to generate a second digital signal in proportion to the rectified and filtered version of the amplified RF signal and having a second converter input coupled to the second detector output and a second converter output coupled to a second processor input, wherein the processor is configured to receive the second digital signal and in response adjust the digital bias signal to further correct dynamic bias errors caused by the amplification variations that have time constants.

6. The digital compensation system of claim 5 wherein the processor comprises:
    a first summation node coupled between the first converter output of the input analog-to-digital converter and the second converter output of the output analog-to-digital converter, wherein the first summation node is configured to generate an error signal at an error signal output; and
    a loop filter coupled between the error signal output and the digital-to-analog converter, wherein the loop filter is configured to smooth the error signal before conversion to the bias signal.

7. The digital compensation system of claim 6 wherein the processor further comprises a first configurable gain block coupled between the input analog-to-digital converter and the first summation node.

8. The digital compensation system of claim 7 wherein the processor further comprises a second configurable gain block coupled between the output analog-to-digital converter and the loop filter.

9. The digital compensation system of claim 8 wherein gain of the second configurable gain block is set to a value that provides a critically damped response to a step change in bias error.

10. The digital compensation system of claim 5 wherein the compensation circuitry further comprises an output coupler coupled to a signal output of the RF amplifier, wherein the output coupler has an output signal tap coupled to the output envelope detector with the output coupler being configured to divert a portion of the amplified RF signal to the output envelope detector.

11. The digital compensation system of claim 10 wherein the RF amplifier is a carrier amplifier of a Doherty amplifier.

12. The digital compensation system of claim 11 further comprising:
  a splitter having a splitter input configured to receive the RF signal, a carrier splitter output coupled to the input of the RF amplifier that is the carrier amplifier, and a peak splitter output;
  a peak amplifier having a peak signal input coupled to the peak splitter output and a peak signal output, wherein the peak amplifier is configured to further amplify the RF signal when the carrier amplifier saturates; and
  a combiner having a peak combiner input coupled to the peak signal output, a carrier combiner input coupled to the output of the RF amplifier that is the carrier amplifier, and a combiner output coupled to the output coupler.

13. The digital compensation system of claim 12 further comprising a configurable peak gain block coupled between a peak bias input of the peak amplifier and the analog output of the digital-to-analog converter.

14. The digital compensation system of claim 1 further comprising:
  a digital pre-distorter having a baseband signal input and a baseband signal output, wherein the digital pre-distorter is configured to linearize the RF amplifier; and
  a baseband-to-RF converter having an RF converter input coupled to the baseband signal output and an RF converter output coupled to the first input of the RF amplifier.

15. The digital compensation system of claim 14 further comprising an RF-to-baseband converter having an analog signal input coupled to the first output of the RF amplifier and a digital signal output coupled to a second input into the digital pre-distorter.

16. The digital compensation system of claim 14 wherein the compensation circuitry is configured to have a compensation settling period that is less than a block duration of the digital pre-distorter.

17. The digital compensation system of claim 16 wherein the block duration of the digital pre-distorter is tens of microseconds.

18. The digital compensation system of claim 2 wherein the 3-dB bandwidth of the input envelope detector is one-tenth of a sampling rate of the input analog-to-digital converter.

19. The digital compensation system of claim 16 wherein the compensation settling period is thirty-two times the period of the sampling rate of the input analog-to-digital converter.

20. The digital compensation system of claim 1 wherein the RF amplifier is of a gallium nitride type.

21. The digital compensation system of claim 1 wherein one of the amplification variations having the at least one time constant is amplification gain fluctuations due to amplifier temperature changes.

22. A radio frequency (RF) module comprising:
  an RF power amplifier having a first input, a first output, and a first bias input, wherein the RF power amplifier is configured to receive an RF signal at the first input and generate an amplified RF signal at the first output; and
  a processor having a first processor input configured to receive a digital signal that is a digital data stream generated by a baseband processor and represents an envelope of the RF signal, and a processor bias output coupled to the first bias input, wherein the processor is configured to receive the digital signal and in response generate a digital bias signal at the processor bias output to correct dynamic bias errors caused by amplification variations that have time constants.

23. The RF module of claim 22 further comprising:
  an output coupler coupled to a signal output of the RF amplifier, wherein the output coupler has an output signal tap configured to divert a portion of the amplified RF signal;
  an output envelope detector having a detector input coupled to the output signal tap and a second detector output, wherein the output envelope detector is configured to generate a rectified and filtered version of the amplified RF signal; and
  an output analog-to-digital converter configured to generate a second digital signal in proportion to the rectified and filtered version of the amplified RF signal and having a second converter input coupled to the second detector output and a second converter output coupled to a second processor input, wherein the processor is configured to receive the second digital signal and in response adjust the digital bias signal to further correct dynamic bias errors caused by the amplification variations that have time constants.

* * * * *